United States Patent [19]

Vandegraaf

[11] Patent Number: 4,864,257
[45] Date of Patent: Sep. 5, 1989

[54] PHASE LOCKED FREQUENCY SYNTHESIZER WITH SINGLE INPUT GAIN COMPENSATED WIDEBAND MODULATION SYSTEM

[75] Inventor: Johannes J. Vandegraaf, Lynchburg, Va.

[73] Assignee: General Electric Company, Lynchburg, Va.

[21] Appl. No.: 244,399

[22] Filed: Sep. 15, 1988

[51] Int. Cl.$^4$ .......................... H03C 3/08; H03C 3/09
[52] U.S. Cl. .................................. 332/125; 332/127; 455/113
[58] Field of Search ...................... 332/18, 19; 331/23; 455/43, 75, 76, 110, 113, 119

[56] References Cited

U.S. PATENT DOCUMENTS

| | | | |
|---|---|---|---|
| 4,052,672 | 10/1977 | Enderby et al. | 332/16 R X |
| 4,117,422 | 9/1978 | Hunt | 332/19 X |
| 4,140,981 | 2/1979 | Bergman | 332/18 |
| 4,189,689 | 2/1980 | Triplett | 332/18 |
| 4,242,649 | 12/1980 | Washburn, Jr. | 332/18 |
| 4,313,209 | 1/1982 | Drucker | 332/18 X |
| 4,503,402 | 3/1985 | Englund, Jr. | 332/19 X |
| 4,510,465 | 4/1985 | Rice et al. | 332/16 T |
| 4,554,517 | 11/1985 | Parniere et al. | 332/18 |

FOREIGN PATENT DOCUMENTS

57-103412  6/1982  Japan ..................................... 332/19

Primary Examiner—Siegfried H. Grimm
Attorney, Agent, or Firm—Nixon & Vanderhye

[57] ABSTRACT

Several embodiments are disclosed of a modulation equalization network associated with a phase locked loop to achieve frequency independent modulation of the VCO. The equalization network is disposed to introduce the modulation signal into the control loop ahead of the loop filter but after the phase detector output. The interposed equalization network requires only a single input port to achieve a flat modulation response thereby lending itself to a modular implementation. The modulation processing is performed totally outside the phase locked loop. The network serves to provide a boost to low frequency signals from the modulation source using an integrator network while providing a high frequency response that is essentially the inverse of the phase locked loop filter response.

37 Claims, 4 Drawing Sheets

PHASE LOCKED FREQUENCY SYNTHESIZER WITH SINGLE INPUT GAIN COMPENSATED WIDEBAND MODULATION SYSTEM

FIELD OF THE INVENTION

This invention relates to phase locked loop frequency synthesizers. More particularly, the invention relates to a method and apparatus for modulating phase locked loops so as to substantially extend the frequency range of modulation.

BACKGROUND AND SUMMARY OF THE INVENTION

Current practice in mobile radio transceivers is to derive the operating frequencies with phase locked loop synthesizers. In such a synthesizer, a phase locked loop circuit controls a variable frequency oscillator, i.e. a voltage controlled oscillator (VCO), to lock in at the frequency and phase angle of a standard or reference frequency. In this fashion, the VCO will have the same accuracy as the standard. The phase locked loop operates to track the operation of the reference oscillator.

In general, a phase locked loop includes a VCO, a reference oscillator, a phase detector and a loop filter. The phase detector compares the phase of the VCO output signal with the phase of the signal from the reference oscillator. The phase detector generates an output signal related to the difference between the two compared signals. This output signal is processed by a low pass filter and is then applied as a control signal to an input terminal of the VCO to control the frequency of the oscillator output signal.

Modulation of the VCO output signal has heretofore typically been accomplished by applying a modulation signal to either the reference oscillator, the VCO or to both the reference oscillator and the VCO. If the reference oscillator is modulated, the modulation response of the phase locked loop has a transfer function which is relatively flat for low frequencies up to approximately the natural resonant frequency of the phase locked loop. The transfer function, however, decreases rapidly at approximately the natural frequency of the phase locked loop. It is therefore generally impractical to use this method of modulation for frequencies greater than the natural frequency of the loop because of the rapidly decreasing loop response at such frequencies.

Such a method is not a satisfactory approach for frequency modulating a VCO in typical FM transmitter applications due to the lack of a high frequency response. The phase locked loop behaves as a low pass filter with respect to modulation applied to the reference oscillator. The ability of the VCO output to track the reference source frequency is limited by the effective loop gain of the feedback control loop.

Alternatively, if the VCO is modulated directly, then the loop behaves as a high pass filter with respect to applied modulation. The modulation response while relatively flat for higher frequencies decreases rapidly for low frequencies, thereby exhibiting a less than satisfactory modulation response characteristic.

In order to achieve wideband modulation, the frequency spectrum of the modulation input must substantially exceed the loop bandwidth of the frequency tracking phase locked loop. In, for example, mobile radio applications, the loop bandwidth is usually less than 100 Hz, while the modulation input may extend from a few Hz to 5 KHz.

One approach that has been employed to achieve wideband modulation is to modulate both the VCO and the reference oscillator in a complementary fashion. In this regard, by modulating both the reference source and the VCO in the proper ratio, a flat modulation response, i.e., a constant modulation level over a wide frequency band, can be obtained.

The viability of a particular method of modulating a phase locked loop is highly application dependent. In this regard, if the phase locked loop bandwidth is large, when compared with the modulation input, when the reference oscillator should be modulated. If it is desirable to handle the audio spectrum which ranges from 200 Hz, to 4 KHz, and if the phase locked loop is able to track to 1 KHz, then the loop will track up to the 1 KHz level and then be unable to satisfactorily track frequencies above 1 KHz. Under such circumstances, it may be possible to modulate the reference oscillator to achieve satisfactory operation.

On the other hand, if the phase locked loop only has a tracking bandwidht of 100 Hz, then the reference oscillator can not be modulated to achieve satisfactory system operation. Thus, based on the limitations of a particular system in a given application context, modulation of the reference oscillator, the VCO or both may be in order.

In many applications, it is undesirable or impossible to modulate the reference source. In this regard, it is often desirable to make the reference oscillator more rock solid stable with respect to its major intended purpose—namely, accurately defining a reference frequency onto which the phase locked loop can lock. This increased stability requirement is inherently inconsistent with an ability to readily modulate or change the frequency of the reference oscillator.

In other applications, the reference frequency source may be a frequency standard which is not accessible. Thus, in such a system which does not include a reference oscillator, it is impossible to modulate the reference source.

In a related patent application, Ser. No. 244,498, Johannes Vandegraaf entitled "PHASE LOCKED FREQUENCY SYNTHESIZER WITH SINGLE INPUT WIDEBAND MODULATION SYSTEM", and filed concurrently herewith, a flat, i.e., frequency independent, modulation of the VCO via a modulation input port of the VCO, is achieved using a dual integration, pre-equalization method for VCO modulation which is described in detail therein. In this copending application, an inverse analogue of a predetermined control loop transfer function is interposed between a modulation source and the VCO in order to achieve wideband modulation.

While this approach to providing wideband modulation has various advantages, it requires a large dynamic range that may be excessive for some applications. For example, in a hand held radio, supply voltages are limited to, for example, 4 volts. If, in order to provide the necessary low frequency boost, a dynamic range is required of, for example, 100 to 1, then the input signal range must be capable of varying from 0.04 volts to 4 volts. Because of problems due to noise, it may be difficult for such a radio to handle such low signal levels. Thus, in applications where supply voltages are limited, the relatively large dynamic range required in the above related application may lead to some difficulties.

The present invention relates to a method and apparatus that achieves wideband modulation that requires less low frequency boost and a smaller dynamic range than the solution in the applicant's copending application. As in the copending application, a modulation equalization network is associated with the phase locked loop to thereby result in frequency independent modulation of the VCO. However, in the present invention, rather than interposing the equalization network between the modulation source and the VCO modulation input, the equalization network is disposed to introduce the modulation signal into the control loop ahead of the loop filter but after the phase detector output.

The interposed equalization network, in contrast to many prior art systems, requires only a single input port to achieve a flat modulation response thereby lending itself to a modular implentation. Additionally, in the present invention, the modulation processing is performed totally outside the phase locked loop. The network serves to provide a boost to low frequency signals from the modulation source using an integrator network while providing a high frequency response that is essentially the inverse of the phase locked loop filter response.

The present modulation system is a single input system which creates a flat frequency response down to very low frequencies and permits wideband modulation of the VCO. Thus, in contrast to many prior art attempts to provide wideband modulation of the phase locked loop, the present invention does not require separate modulation inputs at different points in the control loop.

BRIEF DESCRIPTION OF THE DRAWINGS

These are well as other objects and advantages of the present invention will be better appreciated by reading the following detailed description of the presently preferred exemplary embodiment of the present invention taken in conjunction with the accompanying drawings of which.

DETAILED DESCRIPTION OF THE DRAWINGS

Figure 1:
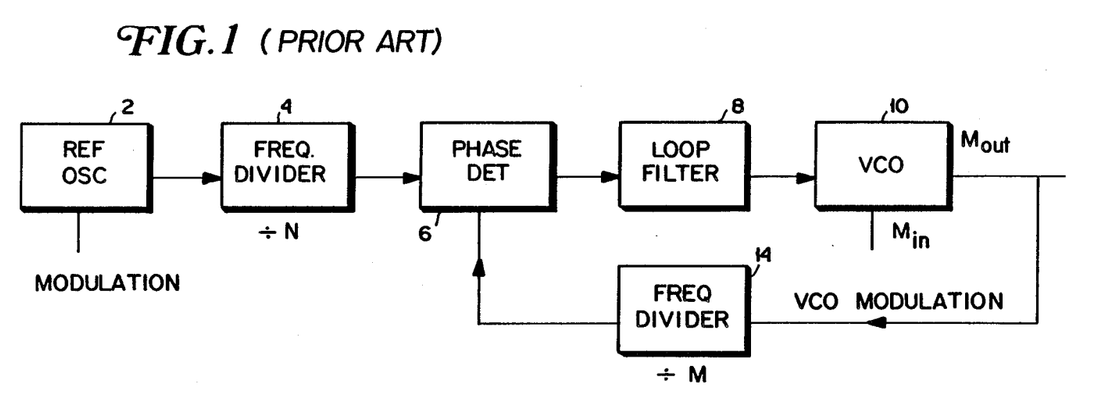
FIG. 1 is a schematic block diagram of a conventional phase locked loop synthesizer.

FIG. 1 shows a conventional phase locked loop synthesizer. Since this phase locked loop synthesizer is conventional, it is only generally described below. As noted above, in mobile radio transceivers operating frequencies are typically derived using such a phase locked loop synthesizer.

The purpose of the phase locked loop circuit shown in FIGS. 1 is to control the variable frequency voltage-controlled oscillator (VCO 10) to lock in at the frequency standard or reference frequency. In FIG. 1, the standard frequency is provided by reference oscillator 2.

VCO 10 may be any of a number of conventional voltage controlled oscillators. Such an oscillator typically uses a semiconductor capacitive diode, i.e., a varactor, whose capacitance varies with the amount of reverse voltage. When such a capacitive diode is placed across an inductor in the oscillator's tuned circuit, the oscillator frequency may be varied by controlling the DC voltage across the diode.

The reference frequency generated by reference oscillator 2, after being divided down by frequency divider 4, is input to a phase detector 6. The phase detector 6 compares the reference oscillator frequency (divided by N, the frequency divider 4 division ratio) with the frequency output (divided by M, the frequency divider 14 division ratio) from the VCO 10 which is fed back to the phase detector 6 via frequency divider 14.

Any difference in phase between the two signals input to phase detector 6 results in an error signal that indicates how much the voltage controlled oscillator differs from the standard. The phase detector 6, for example, may include two diodes in a balanced rectifier circuit. The amount of rectified DC output depends on the difference in phase between the two input frequencies received from frequency divider 4 and frequency divider 14.

The error signal generated by phase detector 6 is input to loop filter 8. Loop filter 8 is typically a low pass filter which may, for example, be an RC circuit that removes AC signal variations of the two oscillators from the rectified DC output of the phase detector 6. The input to the filter 8 is the DC error signal with an AC ripple. The output is a filtered DC control voltage which is amplified to increase the amount of DC control voltage for achieving better control of the VCO 10. The amplified output signal provides the desired DC level for the control voltage in the polarity needed for the varactor in the VCO 10.

Figure 2:
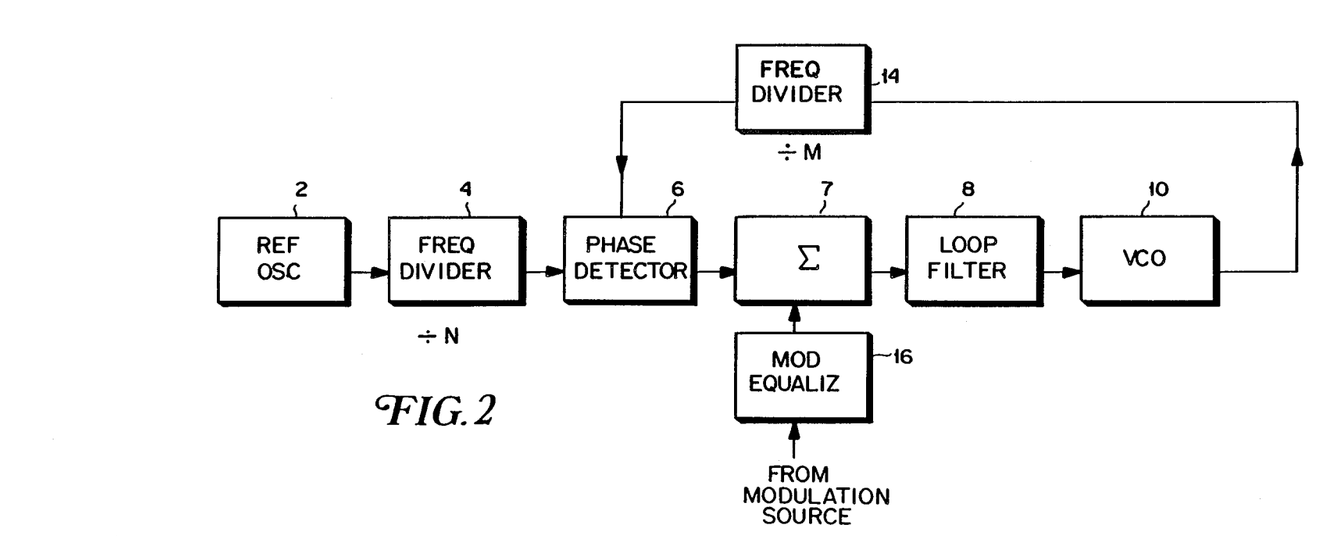
FIG. 2 is a schematic block diagram of a phase locked loop synthesizer having a modulation equalization network in accordance with the present invention.

As shown generally in FIG. 2, in the present invention, a modulation equalization network 16 having an equalizing transfer function is interposed between the modulation source and the input to the loop filter 8, at the output of phase detector 6 in order to achieve wideband modulation of the VCO. It is noted that a transfer function is the ratio of a predetermined output divided by a related input which mathematically expresses how the two signals are related.

For example, if the reference oscillator 2 shown in FIG. 1 were to be modulated, a transfer function may be defined which is the modulation output of the VCO divided by the modulation input to the reference oscillator. This transfer function exhibits a low pass characteristic since the phase locked loop behaves as a low pass filter with respect to modulation applied to the reference oscillator.

Thus, a plot of the magnitude of the ratios of the VCO modulation output to the reference modulation input both as to amplitude and phase angle defines a transfer function exhibiting a low pass frequency response. Since the closed loop bandwidth is generally in the range of 10 Hz to 500 Hz, applying modulation to the reference oscillator is not a satisfactory method for frequency modulating the VCO due to a lack of high frequency response.

In the wideband modulation's system shown in FIG. 2, components which are identically labelled, operate in the same fashion as described in conjunction with FIG. 1 and will not be further described. As shown in FIG. 2, modulation signals from a modulation source are introduced into the phase locked loop by applying modulation to only a single modulation input. In this regard, the modulation signals are processed by the modulation equalization network 16 and are then input to summing device 7.

The error signal generated by phase detector 6 is summed in the summing device 7 with the modulation input signals from modulation equalization network 16. The combined signal is then processed by loop filter 8. The modulation equalization network 16 synthesizes an equalization transfer function $H_C$ to thereby provide a flat modulation response.

The synthesized transfer function $H_C$ is equal to $$\frac{1}{H_s \cdot K_{vco}} + \frac{K\phi}{s \cdot M} \quad (1)$$

where Kvco is equal to the VCO control gain factor, $K\phi$ is equal to the phase detector gain constant, $H_s$ is equal to the loop filter transfer function, M is equal to the division ratio of frequency divider 14 and s is related to frequency (jw). It is noted that this transfer function is the inverse of the closed loop response, i.e., the ratio of the FM output of the VCO versus the modulation input (for a modulating signal applied at the point shown in FIG. 2).

Focussing on the equalizing transfer function $H_c$ it can be seen that the low frequency asymptote constitutes a −6 dB/per octave slope because of the 1/s term. The high frequency response is proportional to the inverse of the loop filter response (i.e., $1/H_s$).

Figures 3, 4, 5:
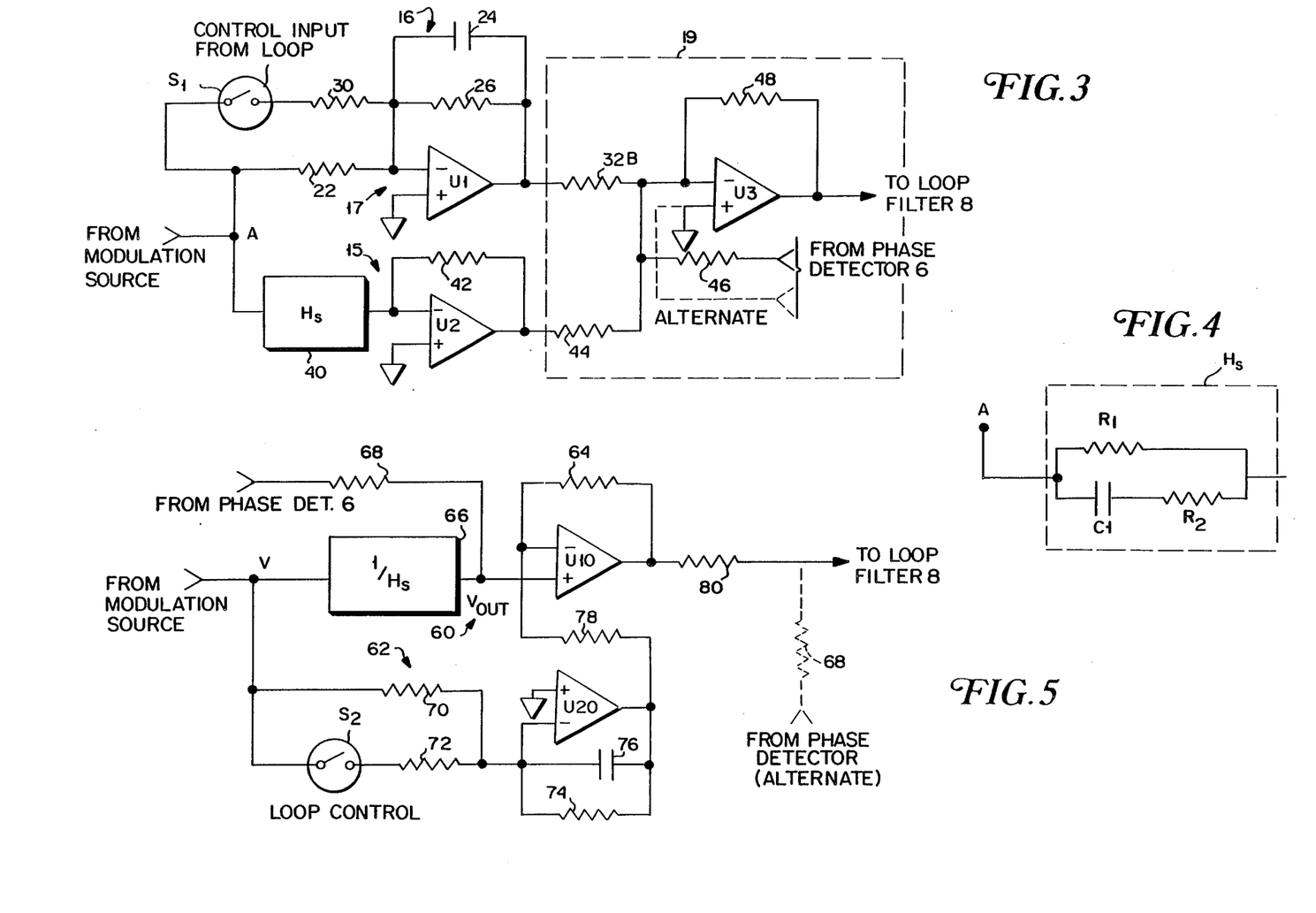
FIG. 3 shows an exemplary implementation of the modulation equalization network shown in FIG. 2.
FIG. 4 is an exemplary circuit which implements the loop filter transfer function represented in FIG. 3.
FIG. 5 is an alternative exemplary embodiment of the modulation equalization network shown in FIG. 3

FIG. 3 shows an exemplary implementation of modulation equalization network 16 in combination with summing device 7 shown in FIG. 2. Signals from a modulation source are introduced into network 16 at node A and are processed in a top branch 17 and a bottom branch 15 which join at node B. Thereafter, signals from branches 15 and 17 are combined in summing stage 19. It is noted that in branch 17, the circuitry associated with operational amplifier U1 synthesizes the $$\frac{K\phi}{s \cdot M}$$

term in the equation set forth above. The circuitry associated with operational amplifier U2 in path 15 synthesizes the $1/H_s$. Kvco term. As shown in FIG. 3, the output of operational amplifiers U1 and U2, which generate the two components of the desired transfer function are combined with the control output from phase detector 6 and input into operational amplifier U3 which in turn is connected to the loop filter to provide the frequency control input of the VCO.

Focussing on the top branch 17, operational amplifier U1 acts as an integrator and serves to boost low frequency signals from the modulation source. If there is a substantial relative change in the division ratio M with frequency, an adjustment may need to be made to the relative contribution of the integrator in the modulation equalizer 16. Such a change in relative contribution is provided via a control input from the loop introduced via switch S1 and resistor 30 as will be described further below. It will be initially presumed that there is not a substantial change in the division ratio M with frequency.

The overall characteristic of the phase locked loop shown in FIGS. 1 and 2 is to considerably boost low frequency components. As the phase locked loop increases in gain for low frequency components, the top branch 17 of FIG. 3, likewise increases the gain of the modulation input to insure that such components are not nullified by the operation of the phase locked loop.

In FIG. 3, the modulation input from node A is input to the inverting input of operational amplifier U1 via resistor 22. Input resistor 22 is used to control the effective gain of operational amplifier U1. In this regard, it is noted that as the resistance 22 is made larger, the voltage out divided by the voltage in of operational amplifier U1 get smaller.

Operational amplifier U1 outputs a signal that is fed back to its inverting input via a parallel RC feedback circuit 26, 24. Operational amplifier U1 operates such that the current input to its inverting input is essentially zero. The non-inverting input of operational amplifier U1 is grounded. The feedback current from operational amplifier U1 is essentially all fed back to the inverting input via capacitor 24. Resistor 26, which is coupled in parallel with capacitor 24 serves to keep U1 stable at low frequencies.

In operation, the output voltage of operational amplifier U1 drops with an associated rise in frequency of the input signal at a 6 db per octave ratio. Thus, when the input frequency goes up by a factor of two, the output voltage drops by a factor of 2. If only capacitor 24 were present in the feedback loop, the output voltage would have a constant 6 db per octave slope that would essentially go to infinity at low frequencies. The presence of the resistor 26, as noted above, provides for a stable operation at such low frequencies.

Operational amplifier U1 and the associated RC feedback circuit operate as an integrator compensating for the low frequency gain in the phase locked loop corresponding to the gain provided by the phase detector 6 shown in FIGS. 1 and 2. While boosting low frequency signals, it is noted that as the frequency of the modulation signals goes up, the gain of operational amplifier U1 goes down by virtue of capacitor 24, the gain being essentially zero at high frequencies.

Turning now to bottom branch 15, it is noted that the output of the operational amplifier U2 is proportional to $1/H_s$, where $H_s$ is the loop filter transfer function. In this regard, the output voltage of operational amplifier U2 divided by its input voltage is equal to minus the resistance of resistor 42 divided by $H_s$, where the input voltage is the voltage input to $H_s$. This voltage ratio is the gain of operational amplifier U2.

Branch 15 in FIG. 3 governs the high frequency response to the equalizer network 16 and is essentially the inverse of the loop filter response 1/H. An exemplary implementation of a circuit which simulates the loop filter transfer function is shown in FIG. 4. Loop filter 8 shown in FIGS. 1 and 2 has a loop filter response which is typically of the lag type. As shown in FIG. 4, the simulated loop filter may, for example, be implemented by a series RC network consisting of a resistor R2 connected to a capacitor C1 in parallel with a resistor R1. The RC network has its input coupled to the modulation source via node A. The output of $H_s$, as shown in FIG. 3 is coupled to the inverting input of operational amplifier U2.

Thus, in the equalizing network of FIG. 3, the bottom branch 15 introduces a response proportional to $1/H_s$ and the top branch 17 provides a transfer function proportional to $1/s$ consistent with the required compensating transfer function shown in equation 1 above. In order to most accurately model the transfer function (1), the relative proportions of the signals generated by the bottom branch 15 and the top branch 17 should be controlled in accordance with the proportionality constants, i.e., the loop parameters $K_{vco}$ for branch 15 and $K\phi$ and M for branch 17 (by, for example, appropriate selection of the gain controlling components in the branches).

The summing stage 19 sums the signals on branches 15 and 17 to thereby result in a modulation input to loop filter 8 that will result in a flat modulation response. In the summing stage 19, the output of operational amplifier U1 is input to the inverting input of operational amplifier U3 via resistor 32. Similarly, the output of operational amplifier U2 is input to the inverting input of operational amplifier U3 via resistor 44. The output of phase detector 6 is input to the same inverting input via resistor 46. Like operational amplifiers U1 and U2, operational amplifier U3 has its non-inverting input grounded.

Alternatively, as indicated by the dashed lines in FIG. 3, the output from the phase detector 6 may be added via the non-inverting input to U3 (which would no longer be grounded).

The output of operational amplifier U3 is proportional to the resistance of feedback resistor 48 and inversely proportional to the sum of resistors 32 plus 44. The value of resistors 32 and 44 are selected to appropriately balance the signal levels in branches 17 and 15, respectively. For example, if the impedance of $H_s$ 40 is very high, it may be necessary to select a relatively low value for resistor 44 compared to resistor 32. It is noted that this implentation is typically utilized where the loop filter 8 shown in FIGS. 1 and 2 does not cut off high frequency components unduly. Thus, the loop filter which is being synthesized by $H_2$ 40 must not cut off the high frequency components of the modulation signals to such an extent that such signals can not be resurrected by operational amplifier U2.

As noted above, with respect to FIGS. 1 and 2, the operation of the phase locked loop serves to lock VCO 10 at the frequency of reference oscillator 2. The function is accomplished by a frequency comparison in phase detector 6 that compares a frequency proportional to the output frequency of VCO 10 with a frequency proportional to that generated by reference oscillator 2 to thereby generate an error signal which is utilized to generate the control voltage applied to VCO 10.

In accordance with the present invention, the modulation that is introduced into the control loop is introduced at the input of loop filter 8 at the output of phase detector 6. As shown in FIG. 3 the output of phase detector 6 is presented to the inverting input of operational amplifier U3, where the phase detector output is combined with the output of branches 15 and 17 described above. Thus, operational amplifier U3 serves, not only as a summing component which combines the signals from branches 15 and 17, but also functions as the summing device 7 shown in FIG. 2. Accordingly, operational amplifier U3 operates as an amplifier within the phase locked loop shown in FIG. 2, while also serving to introduce the modulation equalizing input from branches 15 and 17 into the loop.

It should be recognized that other methods of adding these signals together are also contemplated by the present invention. It is noted, however, that the method utilized for combining such signals must not compromise the VCO's ability to respond to the control error voltages generated by phase detector 6.

An alternative, exemplary embodiment of the present invention which eliminate a separate summing stage such as stage 19 shown in FIG. 3 is shown in FIG. 5. In FIG. 5, operational amplifier U3 has been replaced with a direct resistive addition of signals to be introduced to the loop filter 8.

Turning to FIG. 5, operational amplifier U10 in branch 60 plays a dual role. In this regard, the operational amplifier U10 receives the output of phase detector 6 via resistor 68 at its non-inverting input. Also added to the non-inverting input of U10 is the inverse of the loop filter transfer function $H_s$ described above in conjunction with FIG. 4. In addition to combining the phase detector 6 output and the inverse transfer function from block 66, operational amplifier U10 adds to these signals the output of operational amplifier U20, whose output is coupled to the inverting input of U10. The output of operational amplifier U10 may be used to directly drive loop filter 8 via resistor 80.

Instead of adding the output of phase detector 6 to the non-inverting input of operational amplifier U10 as described above, alternatively the phase detector 6 output may be combined via resistor 68 with the output of operational amplifier U10 and introduced at the input of loop filter 8 as indicated by the dashed lines at the output of U10 in FIG. 5. If the alternative configuration is chosen, it is noted that the value of resistor 80 should be appropriately selected so that the larger portion of the signal transmitted to loop filter 8 is from the phase detector 6 (i.e., the value of resistor 80 should be selected to be significantly greater than the value of resistor 68 in the alternative configuration).

In the bottom branch 62, the modulation input from the modulation source is processed by integrator U20 which serves to considerably boost low frequency components due to the operation of resistor 74 and the parallel coupled capacitor 76 (which feed back the output of operational amplifier U20 to its inverting input). The inverting input of operational amplifier U20 also receives the modulation input via resistor 70. The non-inverting input is grounded or connected to a DC potential. In addition, if adjustments are to be made for variations in loop parameters (as will be explained further below), compensation is provided to the inverting input of amplifier U20 via switch S2 and resistor 72. Operational amplifier U20 therefore functions as an integrator whose voltage output $V_{out}$ is equal to $-K/s.C$ The output of operational amplifier U20 is applied to the inverting input of operational amplifier U10 via resistor 78 thereby resulting in a summation with the signals at the non-inverting input of operational amplifier U10. In addition to the phase detector output which may be applied to the non-inverting input of operational amplifier U10 (as explained above), the output of block 66 which processes the modulation input is supplied to the non-inverting input of operational amplifier U10.

As noted above, block 66 implements the inverse of the loop filter transfer function described above in conjunction with FIGS. 3 and 4. In this regard, if the loop filter 8 operates to attenuate high frequencies, then block 66 acts to correspondingly boost the high freqency signal components from the modulation source. Thus, since the loop filter 8 in the phase locked loop typically acts to attenuate high frequencies, block 66 operates to boost high frequencies, thereby contributing to the achievement of a flat frequency response. In FIG. 5, the voltage output of block 66 divided by the voltage input to block 66 is equal to $1/H_s$.

The signals at the inverting and non-inverting inputs of operational amplifier U10 are combined and, as noted previously, the processed combined modulation signal is input to loop filter 8. The gain of operational amplifier U10 is controlled by the value of resistor 64. Additionally, as noted above, the output of the phase detector 6 can be applied to the non-inverting input of operational amplifier U10. In that case, the output of U10 can drive the loop filter 8 directly. Alternatively, as described above, the phase detector 6 control signal can be resistively combined with the modulation signal of the output of U10. This can be advantageous if correction for changes in loop parameters is necessary as described further below.

When a phase locked loop synthesizer is operated over its range of output frequencies, some loop parameters may change. Although there are certainly applications for which no such compensation is required, there are likewise applications in which compensation for loop parameter changes should take place. For example, for low frequency digital modulation systems, compensation should be made for loop parameter changes.

It is noted that the need to compensate for loop parameter changes typically becomes greater as the frequencies that need to be transmitted through the loop become lower. Typically, compensation would be required if, for example, tone modulation is being employed using frequencies below the audio range e.g., 300 Hz or below.

In a digital modulation system, where frequencies are utilized on the order of 5 to 10 Hz, significant pulse distortion will results unless compensation is introduced via, for example, switch S1 in FIGS. 3 and 5. Such a digital modulation system is significantly more sensitive to changes in loop parameters than a tone modulation sytem, which typically can tolerate such parameter changes.

When a phase locked loop synthesizer is operated over its range of output frequencies, both the countdown ratio, M, and the voltage control oscillator gain factor $K_{vco}$ may change at certain predetermined frequencies. Typically, if the frequency division ratio M is high, the VCO frequency will be high as well and $K_{vco}$ is likely to be reduced, causing a tilt in the frequency response. In for example, mobile radio applications, the effect of change in $K_{vco}$ tends to predominate since the relative change in the division ratio M is usually less than 25%, while $K_{vco}$ may change up to 200%.

One way to compensate for changes in $K_{vco}$ is to shape the gain of a combining amplifier as is described below. Since the loop control voltage is already present in the networks of FIGS. 3 and 5, the loop control voltage may be used to change the VCO gain automatically to compensate for changes in $K_{vco}$.

Figure 6:
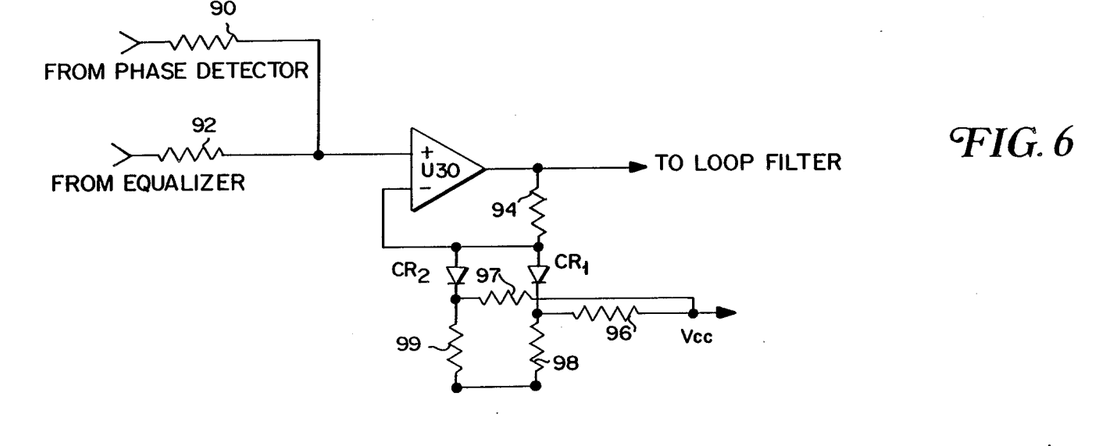
FIG. 6 is an exemplary network for compensating for changes in the gain of the VCO.

An exemplary network which may be used in conjunction with the embodiments of FIGS. 3 and 5 is shown in FIG. 6. In FIG. 6, the DC control output of the phase detector 6 is applied via resistor 90 to the non-inverting input of operational amplifier U30. Added to the control output of the phase detector 6 via resistor 92, is the modulation equalizer output from FIGS. 3 or 5. The embodiments of FIGS. 3 and 5 are, of course, modified to include the phase detector output connection to the configuration shown in FIG. 6.

In FIG. 5, a feedback circuit is coupled from the output of gain shaping stage U30 to the inverting input of amplifier 30. The feedback circuit includes diodes CR1 and CR2 in which different biasing voltages are applied to their cathodes, causing them to start conducting for different DC outputs of the phase detector 6. When a given diode starts to conduct, only a portion of the output of operational amplifier U30 is fed back to the inverting input thereby increasing the gain of the stage. With a plurality of diodes, accurate gain shaping can be achieved to make up for the changes in the VCO gain to achieve a flat modulation output across the tuning range of the VCO.

In operation, as the control voltage from the phase detector increases, the gain of amplifier U30 likewise increases. Focussing on the feedback circuit at the output of U30, the output of U30 is coupled to a resistor 94, which is coupled to the anode of a diode CR1 whose cathode is coupled to resistor 98. The resistor 94 is also coupled to the anode of diode CR2, whose cathode is coupled to resistor 99 which is in turn connected to resistor 98. A voltage source VCC is coupled to the cathodes of CR1 and CR2 via resistors 96 and 97, respectively, to thereby set different bias voltages for the diodes.

When diode CR1 is not conducting, then the gain of operational amplifier U30 is unity. When the diode CR1 conducts, the gain increases. Similarly, once CR2 starts to conduct, the gain of amplifier U30 goes yet higher. Thus, it can be seen that the gain of amplifier U30 can be shaped by appropriately setting the DC bias points for diodes CR1 and CR2. It should be appreciated that any number of diodes may be inserted in the feedback circuit to modify the gain as desired. In this fashion, for a predetermined input control voltage from phase detector 90, a larger output from gain shaping stage U30 is produced to thereby compensate for changes in the gain of the VCO.

Focussing on equation (1) it can be seen that if $K_{vco}$ changes then the output of the compensating network should change. Accordingly, FIG. 6 may be used to insure that the output of the equilization networks of FIGS. 3 or 5 likewise change to more accurately synthesize equation 1. In this fashion, the overall loop gain is stabilized since, as the VCO gain changes, the effective loop gain is modified to maintain a constant loop gain. At the same time, a constant modulation output is achieved across the tuning range of the VCO.

The gain compensating stage of FIG. 6 takes care of the high frequency end of the spectrum. To correct for changes in the division ratio M, the relative contribution of the integrator in the modulation equalizer network of FIGS. 3 and 5 needs to be changed.

Referring again to FIGS. 3 and 5, a switch S1 (or S2) is shown which may be used to compensate for changes in the loop gain with changes in division ratio M. In this regard, the DC output of the phase detector 6 may be used to control the closing of such a switch S1 or to apply a variable bias to an FET stage in order to compensate for the changes in loop gain with M. Such compensation, as noted above, is only necessary if the relative change in the division ratio M is substantial (which typically it is not).

In order to compensate for the changes in the division ratio M, compensation may simply be in the form of increasing the gain of integrating stage U1. Thus, as shown in FIG. 3 by taking a resistor 30 and shunting it across input resistor 22 the gain of operational amplifier U1 increases due to the change in the effective input resistance coupled to the inverting input of U1. Thus, by closing the switch S1, which may be a CMOS switch, in response to the DC output of the phase detector, changes in the loop gain with changes in M may be readily compensated for.

The networks described in FIGS. 3 and 5 (with or without the gain compensating stage shown in FIG. 6) provide accurate equalization down to very low frequencies with the lower limit determined by the available dynamic range. If the control loop has a low frequency response that is not very critical, even simpler networks can be employed which achieve a flat modulation response over an extended frequency range.

For a control loop with a limited phase margin, considerable frequency response peaking results. In order to compensate for such considerable peaking, networks of the types shown in FIGS. 3 and 5 are essential. However, for systems with moderate peaking (less than 3 dB), a cascade of gain shaping stages provide adequate performance, especially if automatic loop gain stabilization is employed as was described previously. The cascaded networks of FIGS. 7 and 8 are suitable where the loop response is well-behaved, i.e, fairly constant loop gain, adequate phase margin.

Figures 8, 9:
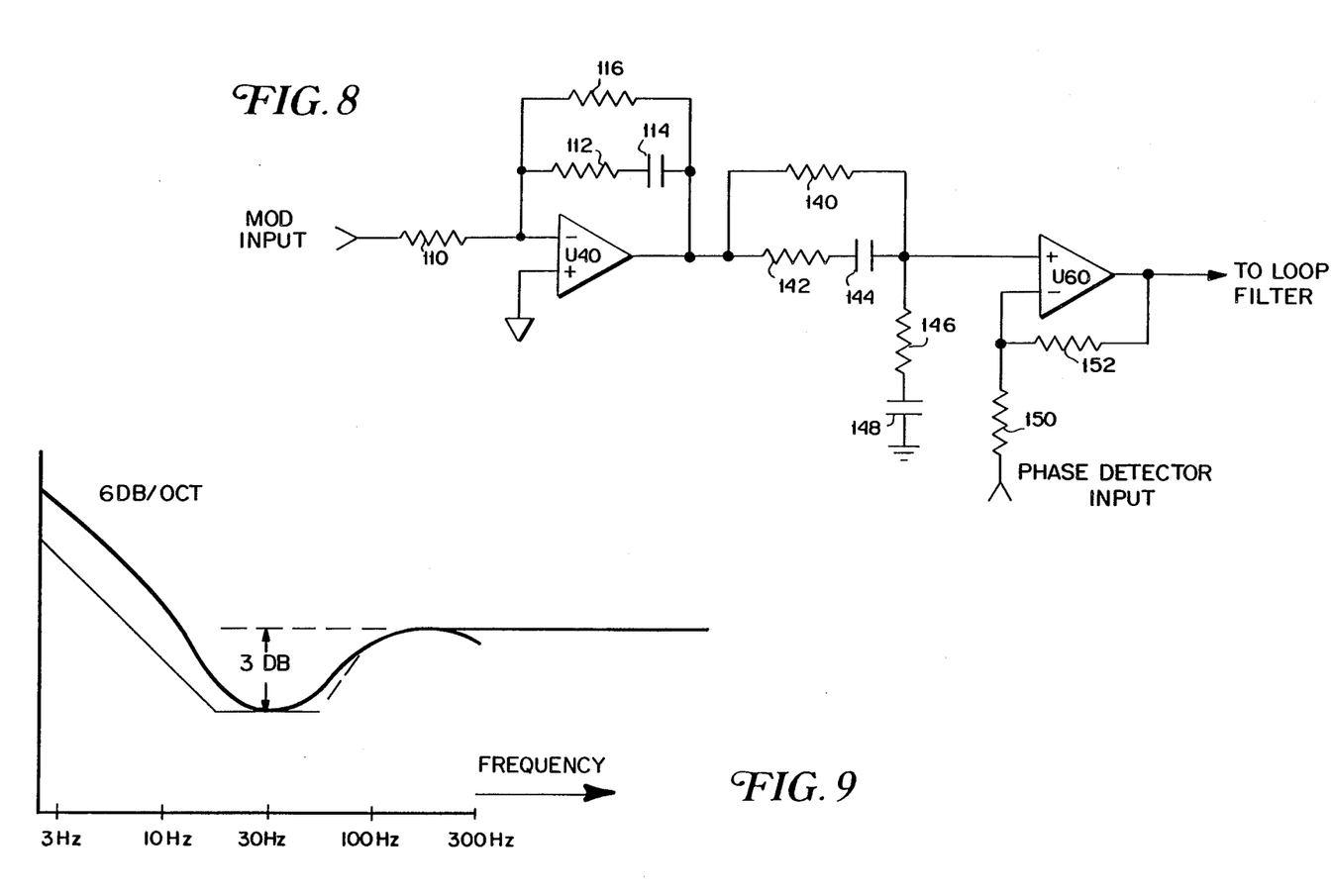
FIG. 9 is the frequency response generated by the embodiments shown in FIGS. 7 and 8.

Such gain shaping stages can provide adequate performance by generating a frequency response such as shown in FIG. 9. By generating such a frequency response for phase locked loop systems which have an ample phase margin, a flat modulation response can be achieved.

Figure 7:
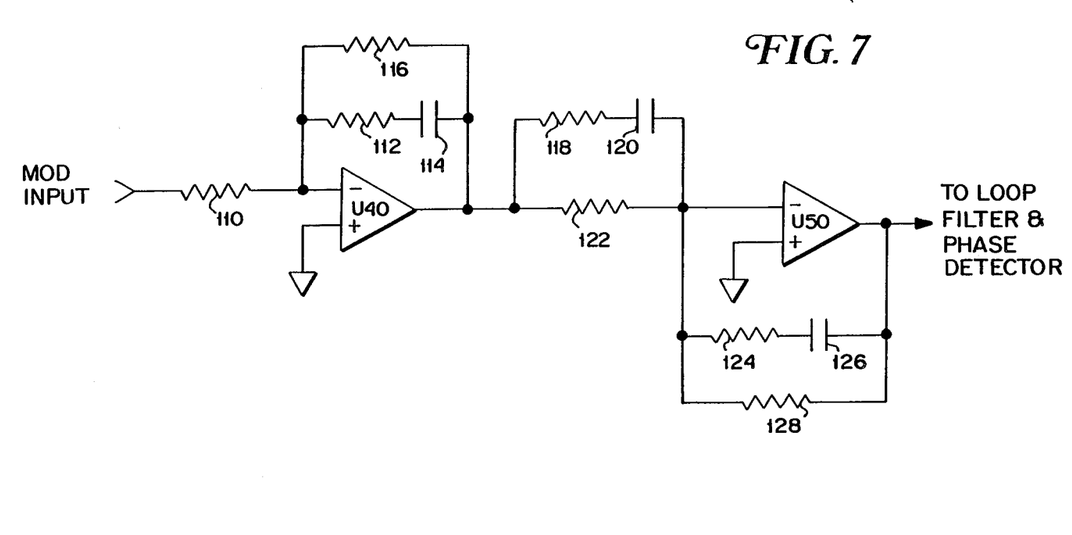
FIGS. 7 and 8 are further alternative embodiments of the modulation equalization network of FIG. 3 using cascaded gain shaping stages for control loops exhibiting moderate peaking.

FIG. 7 shows an exemplary circuit for generating such a frequency response. The first stage associated with operational amplifier U40 receives at its inverting input signals from a modulation source via resistor 110. The voltage out of operational amplifier U40 divided by resistor 110 is equal in magnitude but opposite in sign in the current out of the feedback circuit, which includes resistor 112 in series with capacitor 114 which are connected in parallel with resistor 116.

This stage operates as an integration stage to compensate for the low frequency increases in gain in the phase locked loop due to the operation of loop filter 8. The output characteristic of this stage varies proportionally with 1 divided by the loop filter response which is simulated by the components 112, 114, and 116.

The loop filter 8 has a loop filter response which is typically of the lag type. The characteristic of the loop filter response generated by U40, U50 and the circuitry associated therewith is a downslope at predetermined low frequencies, followed by no slope at a predetermined intermediate range of frequencies, followed by an upslope slope which ultimately levels off to a constant slope at higher frequencies. Thus, this circuitry simulates the "bucket" area indicated at the 3 dB (or less) transition portion shown in FIG. 9.

The circuitry associated with operational amplifier U40 compensates for the effects of the loop filter 8 shown in FIG. 2. The low frequency gain associated with operational amplifier U40 is set by the ratio of minus the resistance 116 divided by the resistance 110. At higher frequencies U40 behaves like an integrator due to capacitor 114 and the gain of U40 begins to drop at 6 dB per octave reaching a high frequency asymptote as determined by the resistance of resistor 112 and 110.

At the output of operational amplifier U40 is a further gain processing stage which includes a resistor 122 coupled in parallel to series connected resistor 118 and capacitor 120. This input stage of operational amplifier U50, includes a resistor 118 and capacitor 120 which tend to shunt resistor 122 at high frequencies, thereby raising the gain of operational amplifier U50 at higher frequencies to generate the higher frequency response shown in FIG. 9.

This stage is coupled to the inverting output of operational amplifier U50, whose output is coupled to a feedback stage which is similar to the feedback stage associated with operational amplifier U40 and which includes a resistor 128 coupled in parallel to series connected resistor 124 and capacitor 126. This feedback circuit is also coupled to the inverting input of operational amplifier U50. The feedback circuit of operational amplifier U50, like the feedback circuit of U40 generates a downslope characteristic.

The total effect of the circuit shown in FIG. 7 is to generate a frequency response similar to that which is shown in FIG. 9 which provides a flat modulation response for phase locked loops having moderate peaking (less than 3 dB). The combined operation of stages U40 and U50 serve to produce a relatively sharp downslope at low frequencies followed by a constant slope followed by an upslope which stabilizes at higher frequencies to a relatively constant level. The RC network 118, 120, and 122 processes the output of the loop filter compensating stage U40, and combines the processed output with the feedback RC circuit associated with U50 to provide the input for operational amplifier's U50 inverting input.

Thus, the first stage in FIG. 7 generates the high and low frequency asmptotes shown in FIG. 9. The second stage produces the negative mid-range "bump" correction, which is necessary to compensate for the operation of the loop filter 8 (in combination with the feedback in the loop through phase detector 6), which likewise produces a bump in the frequency characteristic between the high and low frequency asymptotes.

An alternative embodiment to that shown in FIG. 7 is shown in FIG. 8 for generating the frequency response shown in FIG. 9. The first stage in the embodiment shown in FIG. 8 is identical to the corresponding stage in FIG. 7 and serves to generate the high and low frequency asymptotes with a lag filter. This first stage operates identically to the first stage in FIG. 7 and will not be further described.

Instead of using the second stage of FIG. 7 which utilizes an inverting operational amplifier, the transition bucket portion of FIG. 9 is generated using a transfer network. At the output of operational amplifier U40 is a resistor 140 which is coupled in parallel to series connected resistor 142 and capacitor 144. Coupled to capacitor 144 is a resistor 146, which in turn is connected to capacitor 148, which is grounded.

As the frequency increases, the resistor 142 and capacitor 144 begin to shunt resistor 140 creating a 6 dB per octave downslope. At yet higher frequencies, the resistor 142 serves to generate a constant slope. At higher frequencies, capacitor 148 serves to generate an upward slope, which levels off at a predetermined gain as set by resistor 146.

Thus, this portion of FIG. 8 serves to generate the "bucket" shown at the portion of FIG. 9 indicated to be 3 dB. This circuitry at low frequencies, due to resistor 140 and capacitor 148 generates a 6 dB downslope after which the gain stabilizes to generate a constant slope, after which capacitor 144 serves to shunt resistor 140 and generates an upslope, after which the gain stabilizes again to thereby generate a bucket shape. The circuit shown in FIG. 8 consisting of components 140, 142, 144, 146 and 148 produces the same bucket shape generated by the stage in FIG. 7 associated with operational amplifier U50. However, no operational amplifier is required in FIG. 8.

Operational amplifier U60 in FIG. 8 serves to combine the output of the phase detector 6 via resistor 150 at its inverting input with the input from the previously described bucket generating stage which is received at its non-inverting input. The gain of operational amplifier U60 is determined by feedback resistor 152. The implementation shown in FIG. 8 allows the use of the second operational amplifier to automatically serve as a summing stage to thereby combine the phase detector 6 output with the modulation signal. The output of operational amplifier U60 is coupled to the input of the loop filter 8.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

I claim:

1. Apparatus for wideband modulating a phase locked loop including phase detector means for generating a control signal, loop filter means for processing said control signal, and voltage controlled oscillator means, responsive to said control signal, for generating output signals having a variable frequency, said output signals being modulated by signals from a modulation source, said apparatus comprising:
   first means coupled to said modulation source for attenuating high frequency signals and for boosting low frequency signals received from said modulation source,
   second means coupled to said modulation source for passing at least some of the high frequency signals received from said modulation source;
   means, responsive to signals from said first means and said second means, for summing signals received from the first and second means and for introducing said signals into said phase locked loop at the input to said loop filter, whereby wideband modulation of said phase loop may be attained using only a single modulation input.

2. Apparatus according to claim 1, wherein said first means includes means for compensating for low frequency increases in gain in said phase locked loop by correspondingly increasing the gain of low frequency signals received from said modulation source.

3. Apparatus according to claim 2, wherein said first means includes an integrator means for amplifying said low frequency signals.

4. Apparatus according to claim 3, wherein said phase locked loop includes frequency divider means for dividing the frequency of said voltage controlled oscillator means output signals by a predetermined dividing ratio, said apparatus including means coupled to said first means for changing the gain of said integrator means in response to changes in said dividing ratio.

5. Apparatus according to claim 1, further including means responsive to signals indicative of the operation of said voltage controlled oscillator means for adjusting modulating signals to be introduced at the input of said loop filter to compensate for changes in the gain of the voltage controlled oscillator means.

6. Apparatus according to claim 5, wherein said means for adjusting is coupled to the outputs of said means for summing and said phase detector means, and is responsive to the control signal generated by said phase detector means.

7. Apparatus according to claim 6, wherein said means for adjusting includes an operational amplifier having feedback means including a plurality of diodes, and means for applying different bias voltages to each of said diodes to thereby control the gain of said operational amplifier as the control signal from the phase detector means changes.

8. Apparatus according to claim 1, wherein said summing means includes means coupled to the output of said phase detector means for combining the output of said phase detector means with the signals from said first and second means.

9. Apparatus according to claim 1, wherein said summing means includes means coupled to the output of said phase detector means for amplifying signals transmitted in said phase locked loop and for combining the output of said phase detector means with signals output from said first means and said second means.

10. Apparatus according to claim 1, wherein the output of said phase detector means is coupled to the output of said means for summing.

11. Apparatus for wideband modulating a phase locked loop including phase detector means for generating a control signal, loop filter means for filtering said control signal, and voltage controlled oscillator means responsive to said control signal for generating output signals having a variable frequency, said output signals being modulated by signals from a modulation source, said apparatus comprising:
   first means coupled to said modulation source for boosting low frequency signals and for attenuating high frequency signals received from said modulation source;
   second means for passing signals received from said modulation source so as to exhibit a complementary frequency characteristic to said loop filter means; and
   means for combining signals received from said first and second means to generate a combined modulation signal and for outputting said modulation signal to said loop filter means.

12. Apparatus according to claim 11, wherein said first means includes means for compensating for low frequency increases in gain in said phase locked loop by correspondingly increasing the gain of low frequency signals received from said modulation source.

13. Apparatus according to claim 12, wherein said first means includes an integrator means for amplifying said low frequency signals.

14. Apparatus according to claim 13, wherein said phase locked loop includes frequency divider means for dividing the frequency of said voltage controlled oscillator means output signals by a predetermined dividing ratio, said apparatus including means coupled to said first means for changing the gain of said integrator means in response to changes in said dividing ratio.

15. Apparatus according to claim 11, further including means responsive to signals indicative of the operation of said voltage controlled oscillator means for adjusting modulation signals to be introduced at the input of said loop filter to compensate for changes in the gain of the voltage controlled oscillator means.

16. Apparatus according to claim 11, wherein said combining means includes means coupled to the output of said phase detector means for combining the output of said phase detector means with the signals from said first and second means.

17. Apparatus according to claim 11, wherein the output of said phase detector means is coupled to the output of said means for combining.

18. Apparatus for wideband modulating a phase locked loop at a single input at the output of the phase detector and the input of the loop filter with signals received from a modulation source, said apparatus comprising:
first means for generating the high and low frequency asymptotes of a modulation compensation frequency characteristic for achieving wideband modulation; and
second means coupled to the output of said first means for generating a compensating correction for mid range frequencies between said high and low frequency asymptotes; and
means for coupling the output of said second means to said loop filter.

19. Apparatus according to claim 18, wherein said first means includes means for compensating for the loop filter operation in said phase locked loop.

20. Apparatus according to claim 18, wherein said first means includes a lag filter.

21. Apparatus according to claim 18, wherein said second means includes means for producing a negative mid-range bump by synthesizing a bucket in the frequency response.

22. Apparatus according to claim 18, wherein said first and second means are cascaded stages.

23. A method for widespread modulating a phase locked loop including phase detector means for generating a control signal, loop filter means for filtering said control signal, and voltage controlled oscillator means responsive to said control signal for generating output signals having a variable frequency, said method comprising the steps of:
(a) providing a modulation signal from a modulation source;
(b) boosting the low frequency signals and attenuating high frequency signals received from said modulation source to compensate for low frequency increases in gain in said phase locked loop;
(c) passing signals received from said modulation source so as to exhibit a complementary frequency characteristic to said loop filter means;
(d) combining signals generated in steps (b) and (c) to generate a combined compensated modulation signal; and
(e) outputting said compensated modulation signal to said loop filter means.

24. A method according to claim 23, wherein said boosting steps includes the steps of compensating for low frequency increases in gain in said phase locked loop by correspondingly increasing the gain of low frequency signals received from said modulation source.

25. A method according to claim 23, wherein said boosting step is performed using an integration means, and wherein said phase locked loop includes frequency divider means for dividing the frequency of said voltage controlled oscillator means output signals by a predetermined dividing ratio, said method including the step of changing the gain of said integration means in response to changes in said dividing ratio.

26. A method according to claim 23, further including the step of adjusting modulating signals to be introduced at the input of said loop filter to compensate for changes in the gain of the voltage controlled oscillator means.

27. A method according to claim 26, wherein said step of adjusting includes the step of controlling the gain of an operational amplifier as the control signal from the phase detector means changes.

28. A method according to claim 23, wherein said combining step includes the step of combining the output of said phase detector means with the signals generated in steps (b) and (c).

29. A method according to claim 23, further including the step of combining the compensated modulation signal with the output of said phase detector means.

30. Apparatus for wideband modulating a phase locked loop having a predetermined frequency response and including phase detector means for generating a control signal, loop filter means for processing said control signal, and voltage controlled oscillator means, responsive to said control signal, for generating output signals having a variable frequency, said output signals being modulated by signals from a modulation source, said apparatus comprising:
means coupled to said modulation source for generating a frequency response which is substantially the inverse of said predetermined frequency response for generating compensated modulating signals;
means responsive to signals at least indicative of the operation of said voltage controlled oscillator for adjusting said compensated modulating signals for generating adjusted compensated modulated signals to compensate at least for changes in the gain of the voltage controlled oscillator means; and
means for introducing said adjusted compensated modulating signals at the input of said loop filter means.

31. Apparatus according to claim 30, wherein said means for generating a frequency response includes:
first means for generating the high and low frequency asymptotes of a modulation compensation frequency characteristic for achieving wideband modulation; and
second means coupled to the output of said first means for generating a compensating correction for mid range frequencies between said high and low frequency asymptotes.

32. Apparatus according to claim 31, wherein said first means includes means for compensating for the loop filter operation in said phase locked loop.

33. Apparatus according to claim 31, wherein said first means includes a lag filter.

34. Apparatus according to claim 31, wherein said second means includes means for producing a negative mid-range bump by synthesizing a bucket in the frequency response.

35. Apparatus according to claim 31, wherein said first and second means are cascaded stages.

36. Apparatus according to claim 30, wherein said means for adjusting is coupled to the outputs of said means for introducing and said phase detector means, and is responsive to the control signal generated by said phase detector means.

37. Apparatus according to claim 36, wherein said means for adjusting includes an operational amplifier having feedback means including a plurality of diodes, and means for applying different bias voltages to each of said diodes to thereby control the gain of said operational amplifier as the control signal from the phase detector means changes.

* * * * *